(12) United States Patent
Fortuny

(10) Patent No.: US 11,402,456 B2
(45) Date of Patent: Aug. 2, 2022

(54) HIGH VOLTAGE CURRENT SENSING CIRCUIT WITH ADAPTIVE CALIBRATION

(71) Applicant: Monolithic Power Systems, Inc., San Jose, CA (US)

(72) Inventor: Xavier Trulls Fortuny, Barcelona (ES)

(73) Assignee: Monolithic Power Systems, Inc., San Jose, CA (US)

( * ) Notice: Subject to any disclaimer, the term of this patent is extended or adjusted under 35 U.S.C. 154(b) by 73 days.

(21) Appl. No.: 17/000,745

(22) Filed: Aug. 24, 2020

(65) Prior Publication Data

US 2022/0057469 A1 Feb. 24, 2022

(51) Int. Cl.
*G01R 35/00* (2006.01)
*G01R 19/25* (2006.01)

(52) U.S. Cl.
CPC ....... *G01R 35/005* (2013.01); *G01R 19/2509* (2013.01)

(58) Field of Classification Search
CPC .. G01R 35/005; G01R 19/2509; G01R 19/30; G01R 19/0069; G01R 31/3842; G01R 31/38; G01N 27/66; H04B 17/409; H03F 2203/21184; H03F 2203/21196; H03F 2200/462; H03F 2203/45288; H03F 2203/45718; H03F 2200/481; H02H 7/205; H01H 83/20; H01H 71/125; H01L 29/86; H01L 29/7815; H01L 29/7826;
(Continued)

(56) References Cited

U.S. PATENT DOCUMENTS 7,102,335 B1 * 9/2006 Solie .................. G11C 5/141
323/273
7,202,733 B1 * 4/2007 Aram ................ H03F 3/45475
330/126
(Continued)

OTHER PUBLICATIONS

Wikipedia Contributors. (Jul. 9, 2020). Low-dropout regulator. Wikipedia. Retrieved Jan. 11, 2022, from https://web.archive.org/web/20200812194310/https://en.wikipedia.org/wiki/Low-dropout_regulator (Year: 2020).*

(Continued)

*Primary Examiner* — Daniel R Miller
*Assistant Examiner* — Eric Sebastian Von Wald
(74) *Attorney, Agent, or Firm* — Perkins Coie LLP

(57) ABSTRACT

A current sensing circuit for sensing a current flowing through a current sense resistor, wherein the current sense resistor is configured to receive a variable power input voltage. The current sensing circuit includes: a current sense amplifier having a first input terminal configured to be coupled to a first terminal of the current sense resistor to receive the power input voltage, a second input terminal configured to be coupled to a second terminal of the current sense resistor, and an output terminal for providing a current sensing signal indicative of the current flowing through the current sense resistor; and a calibration circuit configured to be coupled to the first input terminal of the current sense amplifier. The calibration circuit is configured to convert the power input voltage into a calibration current, and provide the calibration current to the current sense amplifier, so as to reduce a change in the current sensing signal caused by a change in the power input voltage.

18 Claims, 9 Drawing Sheets

(58) Field of Classification Search
CPC ......... H03H 2210/021; H03H 11/0427; H03B 2200/0058; H01C 1/16
See application file for complete search history.

(56) References Cited

U.S. PATENT DOCUMENTS

| | | |
|---|---|---|
| 9,882,482 B1 | 1/2018 | Hendry |
| 10,168,363 B1* | 1/2019 | Petenyi .............. G01R 19/0092 |
| 11,082,019 B2* | 8/2021 | Daigle ................ H03F 3/45475 |
| 2014/0159734 A1* | 6/2014 | Knill .................... G01R 31/382 |
| | | 324/426 |
| 2018/0145543 A1* | 5/2018 | Piasecki ................. H02J 50/12 |
| 2019/0068144 A1* | 2/2019 | Puscasu ................ H03F 1/0233 |
| 2021/0048453 A1* | 2/2021 | Chao ................... H03F 3/45071 |

OTHER PUBLICATIONS

Wikipedia Contributors. (Aug. 8, 2019). Electronic circuit. Wikipedia. Retrieved Jan. 18, 2022, from https://web.archive.org/web/20190808084035/https://en.wikipedia.org/wiki/Electronic_circuit (Year: 2019).*

* cited by examiner

HIGH VOLTAGE CURRENT SENSING CIRCUIT WITH ADAPTIVE CALIBRATION

TECHNICAL FIELD

The present invention generally relates to electronic circuits, and more particularly but not exclusively, to current sensing circuits.

BACKGROUND

Current sensing is widely used for precise close-loop control or circuit protection in modern power management. One common current sensing scheme is to insert a current sense resistor into a current path to conduct a current of interest, and then measure the voltage across the resistor through a current sense amplifier, such as shown in FIG. 1.

In the circuit shown in FIG. 1, a current sense resistor RSNS is coupled to sense a current Iin. A current sense amplifier, which includes an operational amplifier OP and resistors R1~R4, is coupled to the resistor RSNS to receive voltage Vin1 and Vin2, and generates a current sensing signal Vs_out based thereupon.

Ideally, the current sensing signal Vs_out is proportional to and only variable with the current Iin. However, in practical applications, this is not true because of finite common mode rejection of the current sense amplifier. Common mode rejection indicates the property of canceling out, at the output of the amplifier, any signals that are common (the same potential on both inputs), while amplifying any signals that are differential (a potential difference between the inputs). Mathematically, common mode rejection can be represented as a common mode rejection ratio:

$$aVRR = \frac{Ad}{|Acm|} \text{ or } 20 \lg \frac{Ad}{|Acm|} \quad (1)$$

Wherein Ad is a differential gain of the current sense amplifier, and Acm is a common mode gain of the current sense amplifier. The practical current sensing signal Vs_out in FIG. 1 thus could be expressed as:

$$Vs\_out = Vd*Ad + Vcm*Acm \quad (2)$$

Wherein Vd is a differential input voltage of the current sense amplifier, which is:

$$Vd = Vin1 - Vin2 = Iin*RSNS \quad (3)$$

Vcm is a common mode input voltage of the current sense amplifier, which is:

$$Vcm = \frac{Vin1 + Vin2}{2} \quad (4)$$

It can be seen from the equation (2) that the current sensing accuracy of the circuit of FIG. 1 is affected by the common mode error (Vcm*Acm). Since the common mode gain Acm is dominated by mismatch among the resistors R1~R4, a commonly adopted solution for improving current sensing accuracy is to reduce the resistor mismatch, e.g. through using large die area for the resistors, or getting the resistors laser trimmed. However, this will inevitably increase the total cost.

SUMMARY

Embodiments of the present invention are directed to a current sensing circuit for sensing a current flowing through a current sense resistor, wherein the current sense resistor is configured to receive a variable power input voltage. The current sensing circuit comprises: a current sense amplifier having a first input terminal, a second input terminal and an output terminal, wherein the first input terminal of the current sense amplifier is configured to be coupled to a first terminal of the current sense resistor to receive the variable power input voltage, the second input terminal of the current sense amplifier is configured to be coupled to a second terminal of the current sense resistor, and the output terminal is configured for providing a current sensing signal indicative of the current flowing through the current sense resistor; and a calibration circuit configured to be coupled to the first input terminal of the current sense amplifier, wherein the calibration circuit is configured to convert the variable power input voltage into a calibration current, and provide the calibration current to the current sense amplifier to reduce a change in the current sensing signal caused by a change in the variable power input voltage.

Embodiments of the present invention are also directed to a semiconductor chip comprising: a first pin configured to be coupled to a first terminal of a current sense resistor to receive a first power input voltage; a second pin configured to be coupled to a second terminal of the current sense resistor; a third pin configured to provide a current sensing signal indicative of the current flowing through the current sense resistor; a fourth pin configured to receive a second power input voltage, wherein the first power input voltage is generated by a power converter based on the second power input voltage; an operational amplifier having a first input terminal, a second input terminal, and an output terminal coupled to the third pin; a first resistor coupled between the first pin and the first input terminal of the operational amplifier; a second resistor coupled between the second input terminal of the operational amplifier and a reference voltage; a third resistor coupled between the second pin and the second input terminal of the operational amplifier; a fourth resistor coupled between the second input terminal of the operational amplifier and the output terminal of the operational amplifier; and a low dropout regulator coupled to the fourth pin, and configured to generate a power supply voltage based on the second power input voltage.

Embodiments of the present invention are further directed to an adaptive calibration method used in a current sensing circuit, wherein the current sensing circuit is configured for sensing a current flowing through a current sense resistor. The adaptive calibration method comprises: converting the voltage across the current sense resistor into an amplifying current through a first trans-conductance amplifier; converting a variable power input voltage at a first terminal of the current sense resistor into a calibration current based on a trim code through a calibration circuit; and converting a combination of the amplifying current and the calibration current into a current sensing signal indicative of the current flowing through the current sense resistor, through a trans-impedance amplifier.

BRIEF DESCRIPTION OF THE DRAWING

The present invention can be further understood with reference to the following detailed description and the appended drawings, wherein like elements are provided with like reference numerals.

DETAILED DESCRIPTION

Figure 1:
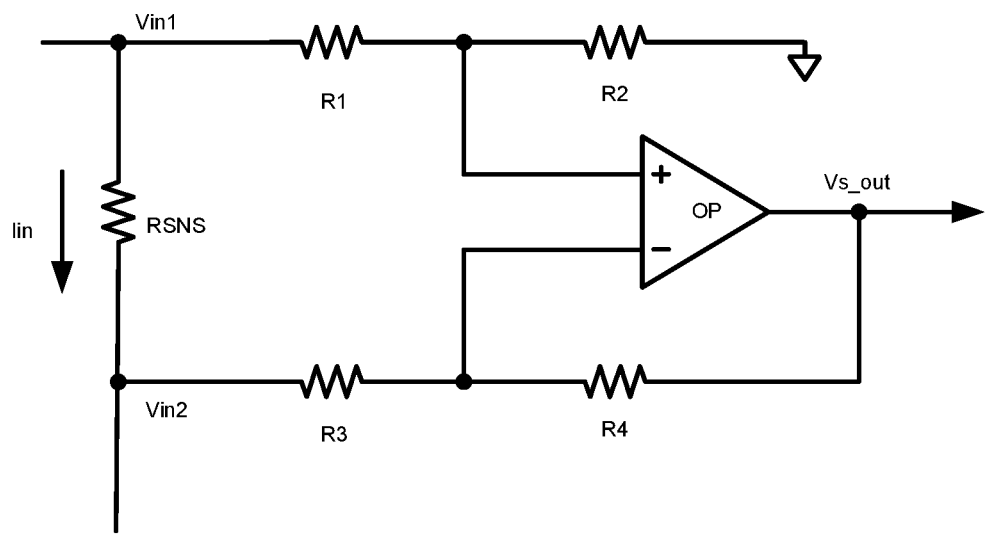
FIG. 1 schematically illustrate a prior art current sense amplifier.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Reference to "one embodiment", "an embodiment", "an example" or "examples" means: certain features, structures, or characteristics are contained in at least one embodiment of the present invention. These "one embodiment", "an embodiment", "an example" and "examples" are not necessarily directed to the same embodiment or example. Furthermore, the features, structures, or characteristics may be combined in one or more embodiments or examples. In addition, it should be noted that the drawings are provided for illustration, and are not necessarily to scale. And when an element is described as "connected" or "coupled" to another element, it can be directly connected or coupled to the other element, or there could exist one or more intermediate elements. In contrast, when an element is referred to as "directly connected" or "directly coupled" to another element, there is no intermediate element.

As discussed above, the current sensing accuracy of conventional current sense amplifier is limited by the common mode error. In applications where the current sense resistor is coupled to a power supply, which provides a power input voltage varying in a wide range, to sense a current provided by the power supply to downstream circuits, the situation is even worse. In this situation, the common mode input voltage could be expressed as:

$$Vcm = \frac{Vhv + (Vhv - Iin*RSNS)}{2} = Vhv - \frac{Iin*RSNS}{2} \quad (5)$$

Wherein Vhv represents the power input voltage provided by the power supply. And the current sensing signal could be expressed as:

$$Vs\_out = Iin*RSNS*Ad + \left(Vhv - \frac{Iin*RSNS}{2}\right)*Acm \quad (6)$$
$$= Iin*RSNS*\left(Ad - \frac{Acm}{2}\right) + Vhv*Acm$$

As can be seen from the equation (6), whenever the power input voltage Vhv provided by the power supply varies, the current sensing signal Vs_out varies too, even if the current Iin flowing through the current sense resistor RSNS remains unchanged. To solve this problem, embodiments of the present invention proposes a current sensing circuit with adaptive calibration, wherein a calibration current generated based on the power input voltage Vhv is fed into the current sense amplifier, to reduce a change in the current sensing signal caused by a change in the power input voltage.

Figure 2:
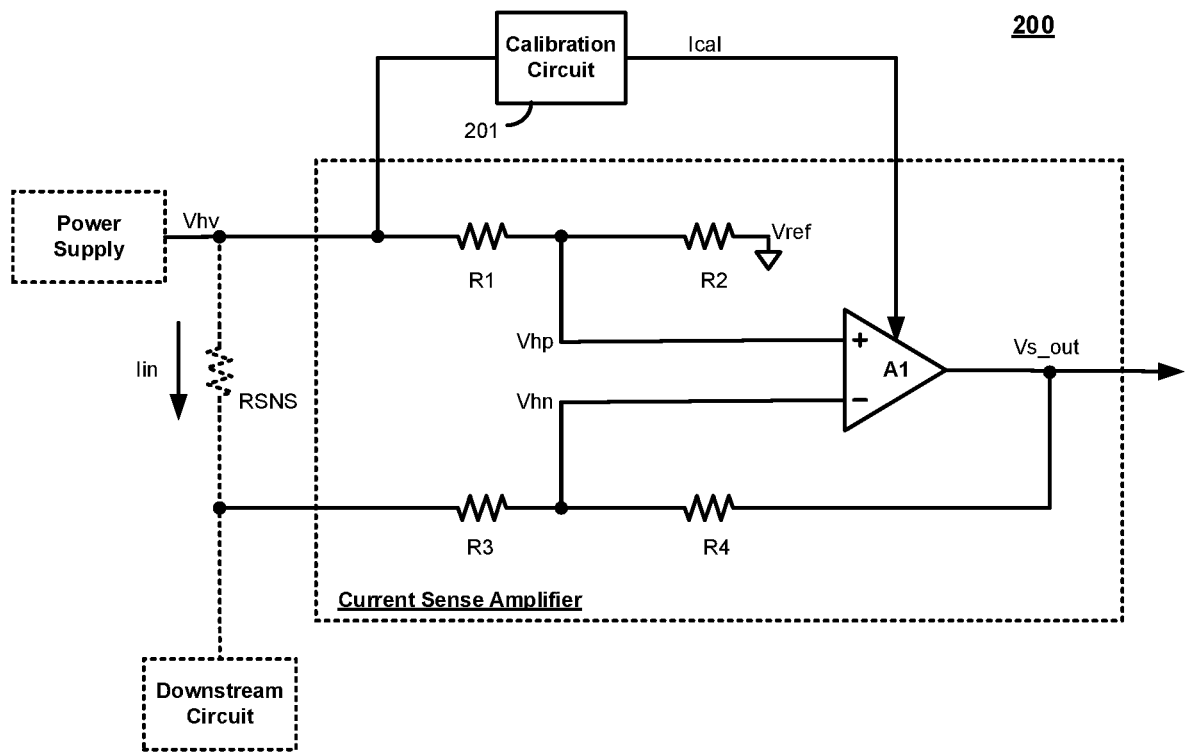
FIG. 2 illustrates a basic concept of a current sensing circuit 200 with adaptive calibration, in accordance with an embodiment of the present invention.

FIG. 2 illustrates a basic concept of a current sensing circuit 200 with adaptive calibration, in accordance with an embodiment of the present invention. A current sense resistor RSNS is coupled between a power supply and a downstream circuit to sense a current Iin. The current sense resistor RSNS has a first terminal coupled to the power supply to receive a power input voltage Vhv, and a second terminal coupled to the downstream circuit. The power input voltage Vhv could vary in a wide voltage range during normal operation, e.g. from 1V up to a high voltage such as 36V. A current sense amplifier, which includes an operational amplifier A1 and resistors R1~R4, is coupled to the resistor RSNS and configured to generate a current sensing signal Vs_out indicative of the current Iin.

The operational amplifier A1 has a non-inverting input terminal, an inverting input terminal, and an output terminal. The resistor R1 has a first terminal coupled to the first terminal of the current sense resistor RSNS, and a second terminal coupled to the non-inverting input terminal of the operational amplifier A1. The resistor R2 has a first terminal coupled to the non-inverting input terminal of the operational amplifier A1, and a second terminal coupled to a reference voltage Vref (e.g. reference ground). The resistor R3 has a first terminal coupled to the second terminal of the current sense resistor RSNS, and a second terminal coupled to the inverting input terminal of the operational amplifier A1. The resistor R4 has a first terminal coupled to the inverting input terminal of the operational amplifier A1, and a second terminal coupled to the output terminal of the operational amplifier A1. Based on a voltage Vhp at the non-inverting input terminal, and a voltage Vhn at the inverting input terminal, the operational amplifier A1 generates the current sensing signal Vs_out at its output terminal.

Compared with the prior art solution shown in FIG. 1, the circuit of FIG. 2 further includes a calibration circuit 201, which is coupled to the first terminal of the resistor RSNS, and configured to convert the power input voltage Vhv into a calibration current Ical. This calibration current Ical is fed into the operational amplifier A1, e.g. through a low-impedance path, for canceling or minimizing the $V_{hv}*A_{cm}$ component in the equation (6), so as to reduce a change in the current sensing signal Vs_out caused by a change in the power input voltage Vhv. In some embodiments, the calibration current Ical is proportional to the power input voltage Vhv.

Figure 3:
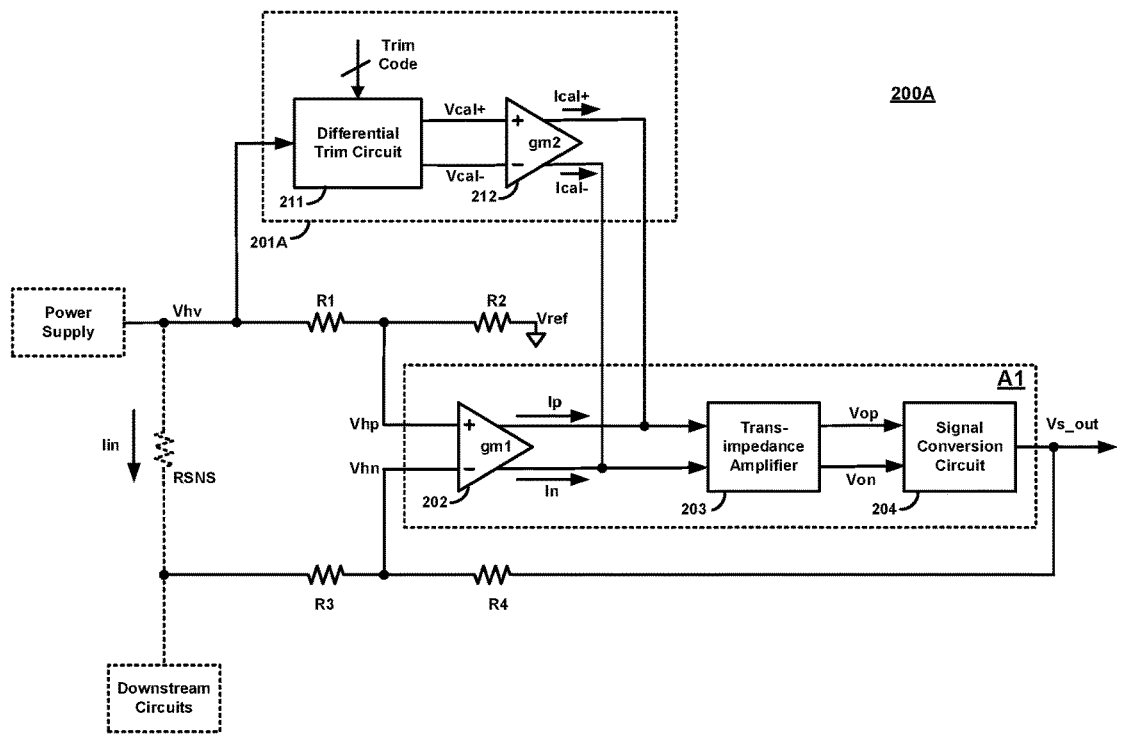
FIG. 3 is a block diagram of a current sensing circuit 200A in accordance with an embodiment of the present invention.

FIG. 3 is a block diagram of a current sensing circuit 200A in accordance with an embodiment of the present invention. The operational amplifier A1 includes a first trans-conductance amplifier 202, a trans-impedance amplifier 203 and a signal conversion circuit 204. The first trans-conductance amplifier 202 has a non-inverting input terminal, an inverting input terminal, a first output terminal and a second output terminal, wherein the non-inverting input terminal is coupled to the common connection node of the resistors R1 and R2 to receive the voltage Vhp, the second input terminal is coupled to the common connection node of the resistors R3 and R4 to receive the voltage Vhn. Based on the voltage Vhp and Vhn, the first trans-conductance amplifier 202 generates a first amplifying current Ip and a second amplifying current In respectively at the first output terminal and the second output terminal. The trans-impedance amplifier 203 has a first input terminal, a second input terminal, a first output terminal and a second output terminal, wherein the first input terminal of the trans-impedance amplifier 203 is coupled to the first output terminal of the first trans-conductance amplifier 202, the second input terminal of the trans-impedance amplifier 203 is coupled to the second output terminal of the first trans-conductance amplifier 202. The signal conversion circuit 204 has a first input terminal, a second input terminal and an output terminal, wherein the first input terminal of the signal conversion circuit 204 is coupled to the first output terminal of the trans-impedance amplifier 203 to receive a voltage Vop. The second input terminal of the signal conversion circuit 204 is coupled to the second output terminal of the trans-impedance amplifier 203 to receive a voltage Von. Based on the voltage Vop and Von, the signal conversion circuit 204 generates the current sensing signal Vs_out at its output terminal.

The calibration circuit 201A includes a differential trim circuit 211 and a second trans-conductance amplifier 212. The differential trim circuit 211 has an input terminal, a first output terminal and a second output terminal, wherein the input terminal is coupled to the first terminal of the resistor RSNS. The differential trim circuit 211 converts the power input voltage Vhv into a first calibration voltage Vcal+ at the first output terminal and a second calibration voltage Vcal− at the second output terminal. The second trans-conductance amplifier 212 has a non-inverting input terminal, an inverting input terminal, a first output terminal and a second output terminal, wherein the non-inverting input terminal is coupled to the first output terminal of the differential trim circuit 211 to receive the first calibration voltage Vcal+, the second input terminal is coupled to the second output terminal of the differential trim circuit 211 to receive the second calibration voltage Vcal−. The first output terminal of the second trans-conductance amplifier 212 is coupled to the first input terminal of the trans-impedance amplifier 203, the second output terminal of the second trans-conductance amplifier 212 is coupled to the second input terminal of the trans-impedance amplifier 203. Based on the calibration voltages Vcal+ and Vcal−, the second trans-conductance amplifier 212 generates a first calibration current Ical+ and a second calibration current Ical− respectively at the first output terminal and the second output terminal. The calibration currents Ical+ and Ical− are typically matched. They could have the same amplitude, which varies with (e.g. proportional to) the power input voltage Vhv, but with opposite direction. When one calibration current flows from the second trans-conductance amplifier 212 into the trans-impedance amplifier 203, the other one flows out from the trans-impedance amplifier 203 into the second trans-conductance amplifier 212, and vice versa.

If the equivalent resistance of the trans-impedance amplifier 203 is RL, it can be obtained that:

$$Vop-Von=(Ip-In)*RL+[(Ical+)-(Ical-)]*RL \quad (7)$$

This equation shows how the calibration currents are fed into the operational amplifier in the embodiment of FIG. 3. Since the calibration is performed in the current domain through a low-impedance path after an initial gain stage (202), the precision requirements of the calibration circuit is decreased. And the calibration is independent of the components in the input signal path and its associated variations.

If the trans-conductance of the first trans-conductance amplifier 202 is gm1, it can be obtained that:

$$Ip-In=(Vhp-Vhn)*gm1 \quad (8)$$

The difference between the calibration voltages Vcal+ and Vcal− is a function of the power input voltage Vhv, and this function f(Vhv) could be adjusted by a trim code. If the trans-conductance of the second trans-conductance amplifier 212 is gm2, the calibration currents Ical+ and Ical− could be expressed as:

$$(Ical+)-(Ical-)=[(Vcal+)-(Vcal-)]*gm2=f(Vhv)*gm2 \quad (9)$$

Combining the equations (6)~(8), it could be obtained that:

$$Vop-Von=(Vhp-Vhn)*gm1*RL+f(Vhv)*gm2*RL \quad (10)$$

The trim code for adjusting the function f(Vhv) is normally determined during production test. Therefore, when the trim code changes, the calibration currents Ical+, Ical− as well as the calibration voltages Vcal+, Vcal− change.

Figure 4:
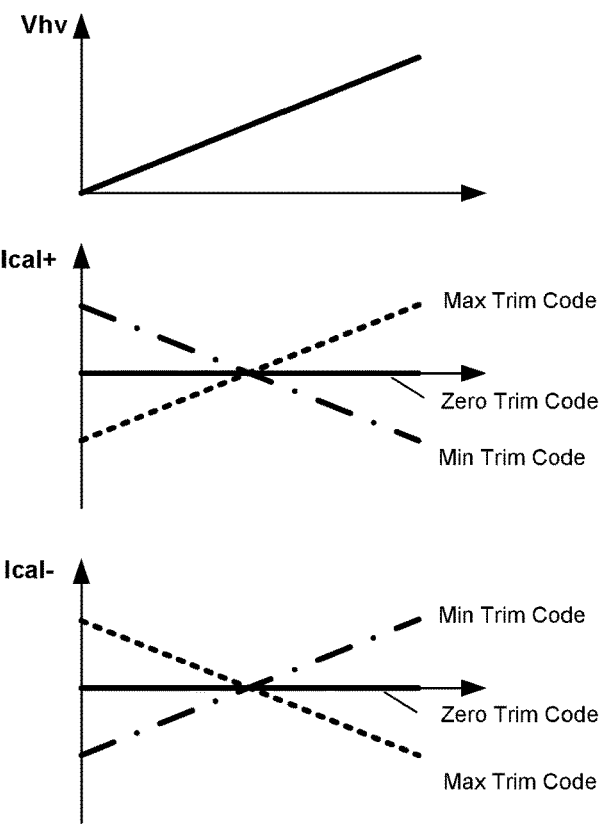
FIG. 4 illustrates diagrams showing relationship between the calibration currents and the power input voltage under different trim codes, in accordance with an embodiment of the present invention.

FIG. 4 illustrates diagrams showing relationship between the calibration currents Ical+, Ical− and the power input voltage Vhv under different trim code, in accordance with an embodiment of the present invention. As can be seen from the waveforms, the calibration currents Ical+ and Ical− are both zero when the trim code is zero. The waveforms with dotted line correspond to calibration currents under a maximum trim code, and the waveforms with dot-dash line correspond to calibration currents under a minimum trim code. A zero trim code means the calibration circuit does not provide any differential calibration current [(Ical+)−(Ical−)] to the current sense amplifier A1. The maximum trim code will result in a maximum positive differential calibration current applied to the current sense amplifier A1, basically through adding current into the positive path (e.g., the first input terminal of the trans-impedance amplifier 203), and subtracting current from the negative path (e.g., the second input terminal of the trans-impedance amplifier 203). The minimum trim code works in the opposite operation. The minimum trim code will result in a maximum negative differential calibration current applied to the current sense amplifier A1, basically through subtracting current from the positive path, and adding current into the negative path.

Figure 5:
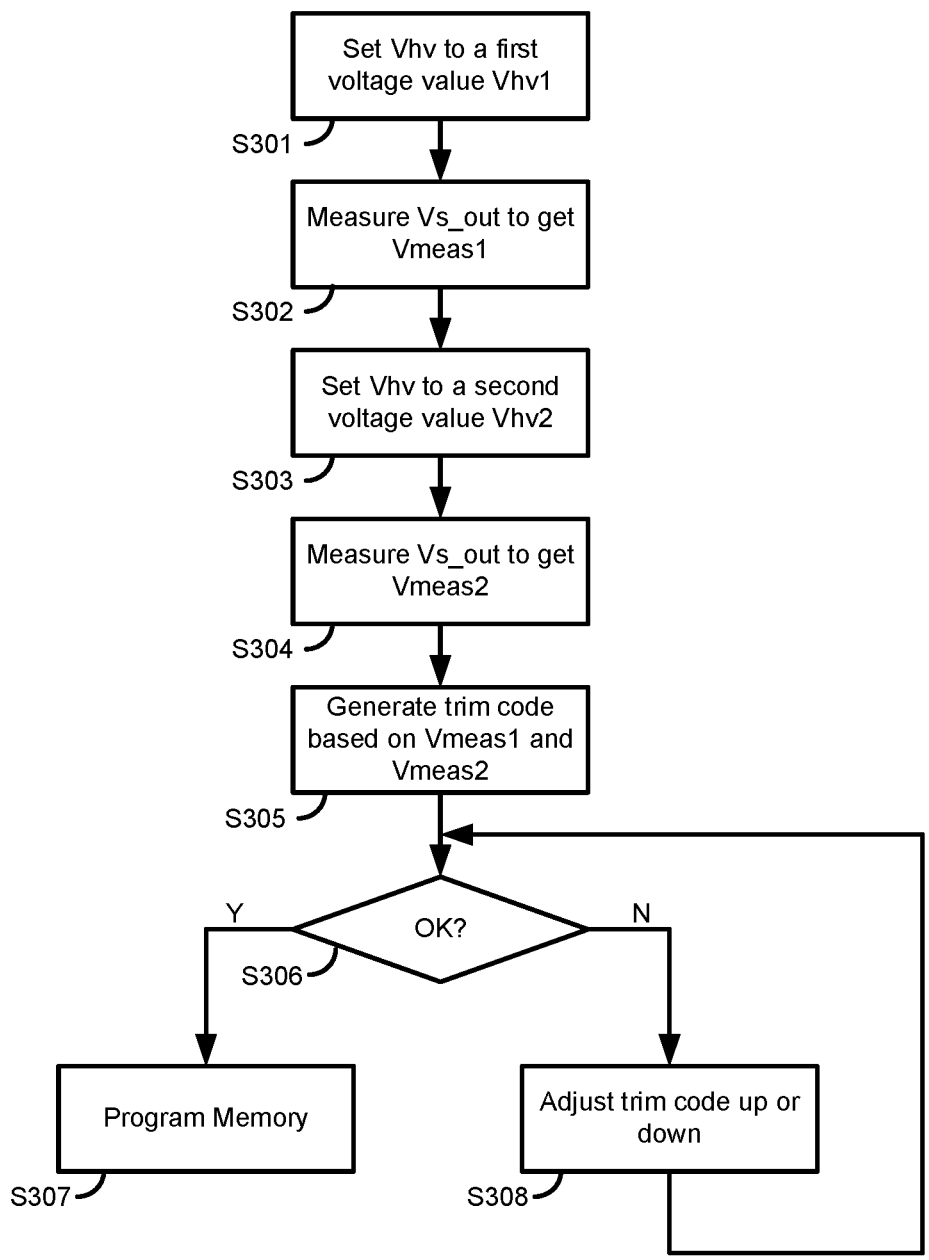
FIG. 5 is a trimming flowchart of the current sensing circuit used in production test, in accordance with an embodiment of the present invention.

FIG. 5 is a trimming flowchart of the current sensing circuit used in production test in accordance with an embodiment of the present invention. It includes steps S301-S305.

In step S301, the voltage Vhv is set to a first voltage value Vhv1. In step S302, the current sense signal Vs_out is measured to get a first current sensing voltage Vmeas1.

In step S303, the voltage Vhv is set to a second voltage value Vhv2. In step S304, the current sense signal Vs_out is measured to get a second current sensing voltage Vmeas2.

In step S305, a trim code is generated based on the difference between Vmeas1 and Vmeas2. This could be realized through calculation, or look-up table. Then the trim code could be programmed, e.g., into a one-time programmable memory.

In some embodiments, a second pass of trim code adjustment is needed due to process and mismatch variations. During step S306, the trim code gained during step S305 is provided to the differential trim circuit, and steps similar to S301~S304 are conducted again to determine whether the difference between Vmeas1 and Vmeas2 approaches zero. If the difference between Vmeas1 and Vmeas2 approaches zero, the process will go to step S307 to program the memory. Otherwise, the process will go to step S308 to further adjust the trim code.

In some exemplary embodiments, the first voltage value Vhv1 is the maximum value (e.g. 36V) of Vhv, and the second voltage value Vhv2 is the minimum value (e.g. 1V) of Vhv. But this is not intended to limit the invention, and other value in the operation range of Vhv could also be used.

Figure 6:
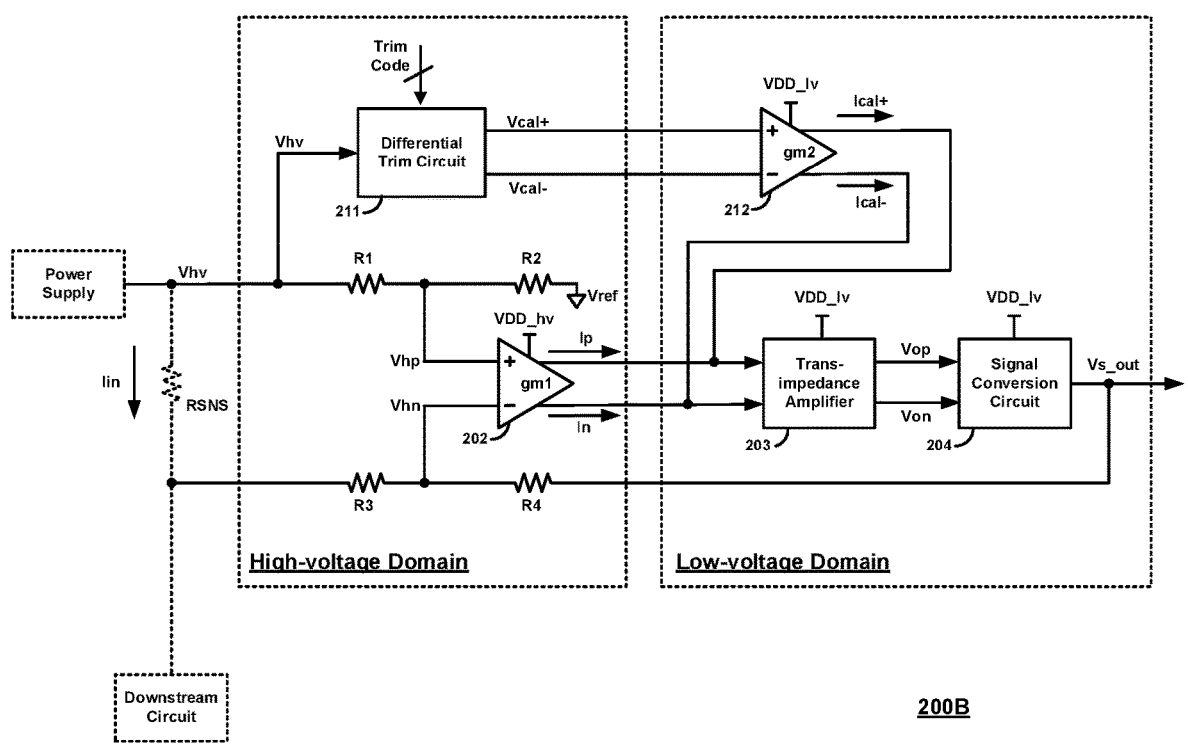
FIG. 6 is a block diagram of a current sensing circuit 200B with a high-voltage domain and a low-voltage domain, in accordance with an embodiment of the present invention.

FIG. 6 is a block diagram of a current sensing circuit 200B with a high-voltage domain and a low-voltage domain, in accordance with an embodiment of the present invention. The trans-impedance amplifier 203, signal conversion circuit 204 and second trans-conductance amplifier 212 are all powered by a low-voltage power supply voltage VDD_lv (e.g. 5V provided by a low dropout regulator) lower than the power input voltage Vhv, thus are in a low-voltage domain. The first trans-conductance amplifier 202 could be powered by a high-voltage power supply voltage VDD_hv. This high-voltage power supply voltage VDD_hv may be equal to the power input voltage Vhv, or output by a positive charge pump which provided a voltage higher than Vhv. Therefore, the differential trim circuit 211 and the first trans-conductance amplifier 202 both work in a high-voltage domain.

As can be seen from FIG. 6, the calibration is conducted directly on the low-voltage domain, resulting in a simpler internal circuit protection scheme to over-voltage events, more reliable specially for applications such as automotive. Furthermore, the embodiment of FIG. 6 avoids tapping into the input signal path before the operational amplifier A1 has done the high-voltage to low-voltage signal conversion and initial amplification, which could add parasitic components affecting the amplifier precision. And the noise-immunity of the current sensing circuit is increased by performing all calibration operations in the low-voltage domain, which is connected to a low-noise LDO (low dropout regulator).

Figure 7:
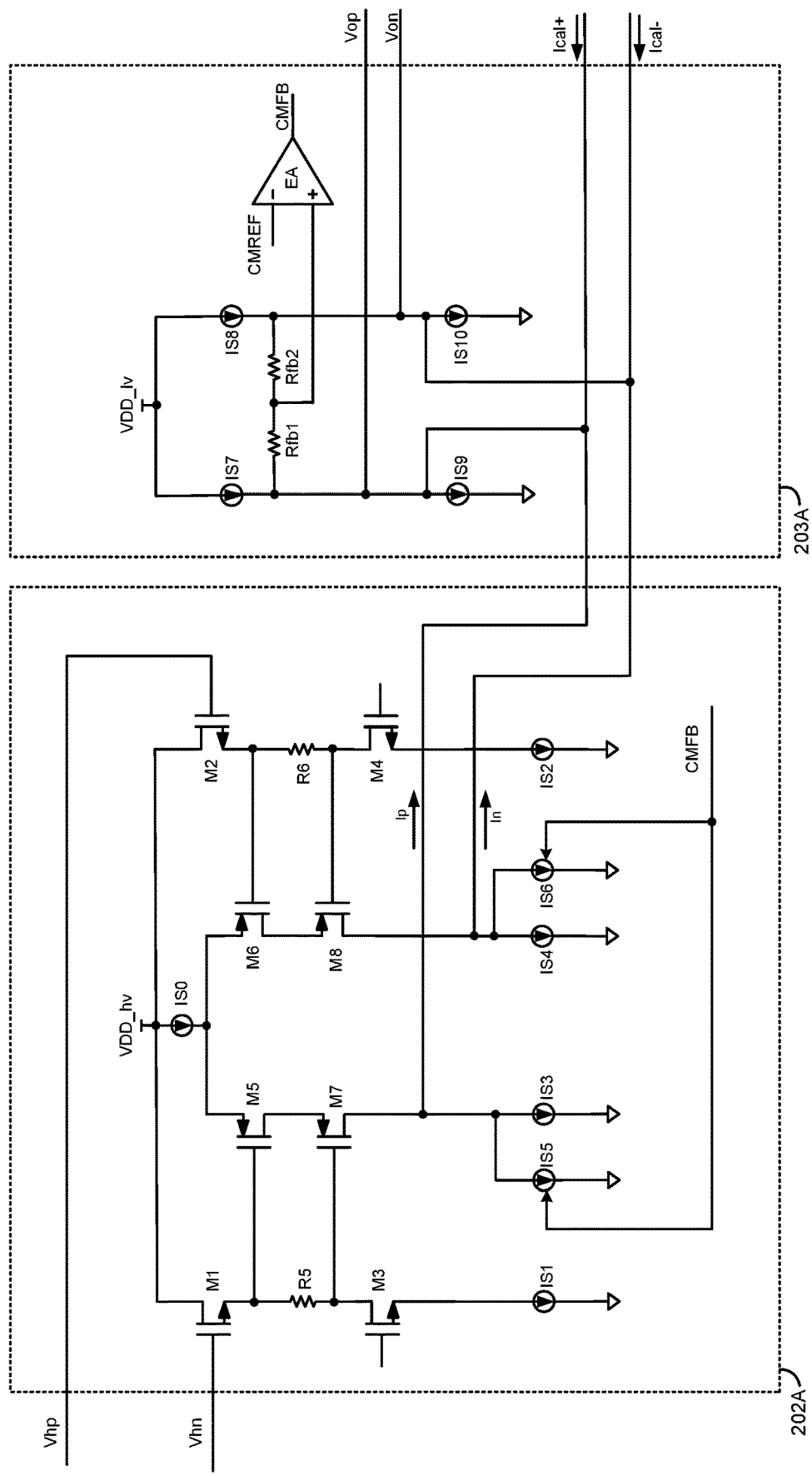
FIG. 7 illustrates a first trans-conductance amplifier 202A and a trans-impedance amplifier 203A in accordance with an embodiment of the present invention.

FIG. 7 illustrates a first trans-conductance amplifier 202A and a trans-impedance amplifier 203A in accordance with an embodiment of the present invention. The trans-conductance amplifier 202A includes transistors M1-M8, resistors R5, R6, and current sources IS1~S6, connected as shown in the figure. The transistors M1~M4, resistors R5, R6 and current sources IS1, IS2 form a level shift circuit. The outputs of this level shift circuit are provided to an initial amplifying stage including transistors M5-M8 and current sources IS0, IS3~IS4 to generate the first amplifying current Ip and second amplifying current In.

Each of the transistors has a drain terminal, a source terminal and a gate terminal. The drain terminals of the transistors M1 and M2 are both coupled to the power supply voltage VDD_hv. The gate terminal of the transistor M1 is configured to receive the voltage Vhn, and the gate terminal of the transistor M2 is configured to receive the voltage Vhp. The resistor R5 is coupled between the source terminal of the transistor M1 and the drain terminal of the transistor M3. The current source IS1 is coupled between the source terminal of the transistor M3 and the reference ground. The resistor R6 is coupled between the source terminal of the transistor M2 and the drain terminal of the transistor M4. The current source IS2 is coupled between the source terminal of the transistor M4 and the reference ground.

The current source IS0 has a first terminal coupled to the power supply voltage VDD_hv, and a second terminal coupled to the source terminals of transistors M5 and M6. The gate terminal of the transistor M5 is coupled to the source terminal of the transistor M1 and the first terminal of the resistor R5. The source terminal of the transistor M7 is coupled to the drain terminal of the transistor M5, the gate terminal of the transistor M7 is coupled to the second terminal of the resistor R5 and the drain terminal of the transistor M3. The drain terminal of the transistor M7 and a first terminal of the current source IS3 are coupled together, and further coupled to the trans-impedance amplifier 203A to provide the first amplifying current Ip. A second terminal of the current source IS3 is coupled to the reference ground. The gate terminal of the transistor M6 is coupled to the source terminal of the transistor M2 and the first terminal of the resistor R6. The source terminal of the transistor M8 is coupled to the drain terminal of the transistor M6, the gate terminal of the transistor M8 is coupled to the second terminal of the resistor R6 and the drain terminal of the transistor M4. The drain terminal of the transistor M8 and a first terminal of the current source IS4 are coupled together, and further coupled to the trans-impedance amplifier 203A to provide the second amplifying current In. A second terminal of the current source IS4 is coupled to the reference ground.

The trans-impedance amplifier 203A includes current sources IS7~IS10. The current sources IS7 and IS8 both have a first terminal coupled to the power supply voltage VDD_lv. The current source IS9 is coupled between the second terminal of the current source IS7 and the reference ground, and the current source IS10 is coupled between the second terminal of the current source IS8 and the reference ground. The first amplifying current Ip and the first calibration current Ical+ are both provided to the common connection node of the current sources IS7 and IS9 to generate the voltage Vop. The second amplifying current In and the second calibration current Ical− are both provided to the common connection node of the current sources IS8 and IS10 to generate the voltage Von. Since all the current sources have a finite output resistance, the equivalent input impedance RL of the trans-impedance amplifier 203A could be expressed as:

$$RL = RIS9 // RIS7 = RIS10 // RIS8 \qquad (11)$$

Wherein RIS7~RIS10 are output resistance of the current sources IS7~IS10.

In one embodiment, the initial amplifying stage in the trans-conductance amplifier 202A further comprises a current source IS5 coupled to the current source IS3 in parallel and a current source IS6 coupled to the current source IS4 is parallel, the trans-impedance amplifier 203A further comprises resistors Rfb1, Rfb2 and an error amplifier EA. The resistors Rfb1 and Rfb2 are used to sense the common mode voltage of the voltage Vop and Von. The sensed common mode voltage is then compared with a reference voltage CMREF by the error amplifier EA, and a feedback signal CMFB is generated based on the comparison to control the current sources IS5 and IS6.

Figure 8:
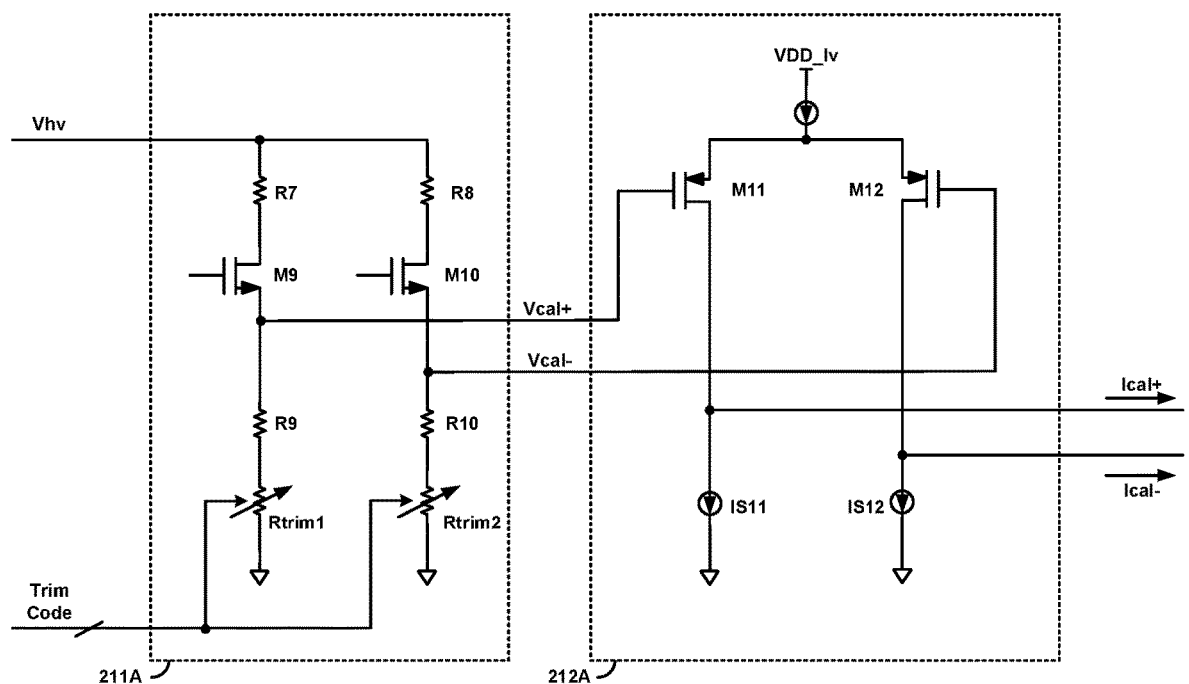
FIG. 8 illustrates a differential trim circuit 211A and a second trans-conductance amplifier 212A in accordance with an embodiment of the present invention.

FIG. 8 illustrates a differential trim circuit 211A and a second trans-conductance amplifier 212A in accordance with an embodiment of the present invention. The differential trim circuit 211A includes resistors R7~R10, variable resistors Rtrim1, Rtrim2, and transistors M9, M10. The resistors R7, R9, Rtrim1 and transistor M9 are serially coupled between the power input voltage Vhv and the reference ground. And so are the resistors R8, R10, Rtrim2 and transistor M10. The resistance of variable resistors Rtrim1 and Rtrim2 vary with the trim code, so the calibration voltages Vcal+ and Vcal– could be trimmed in opposite ways with matched parameters.

According to the embodiment shown in FIG. 8, the resistor R7 has a first terminal coupled to the power input voltage Vhv, and a second terminal coupled to the drain terminal of the transistor M9. The source terminal of the transistor M9 and a first terminal of the resistor R9 are coupled together, and configured to provide the first calibration voltage Vcal+. The resistor Rtrim1 is coupled between the second terminal of the resistor R9 and the reference ground. The resistor R8 has a first terminal coupled to the power input voltage Vhv, and a second terminal coupled to the drain terminal of the transistor M10. The source terminal of the transistor M10 and a first terminal of the resistor R10 are coupled together, and configured to provide the second calibration voltage Vcal–. The resistor Rtrim2 is coupled between the second terminal of the resistor R10 and the reference ground. It should be noted that, however, these components and connections are not limiting, and other suitable circuit structures could also be adopted by the differential trim circuit.

The second trans-conductance amplifier 212A includes transistor M11, M12, and current sources IS11, IS12, connected as shown in FIG. 8. The second trans-conductance amplifier 212A converters the calibration voltages Vcal+ and Vcal– into calibration currents Ical+ and Ical–, which are subsequently fed into the operational amplifier A1 through a low-impedance path.

Figure 9:
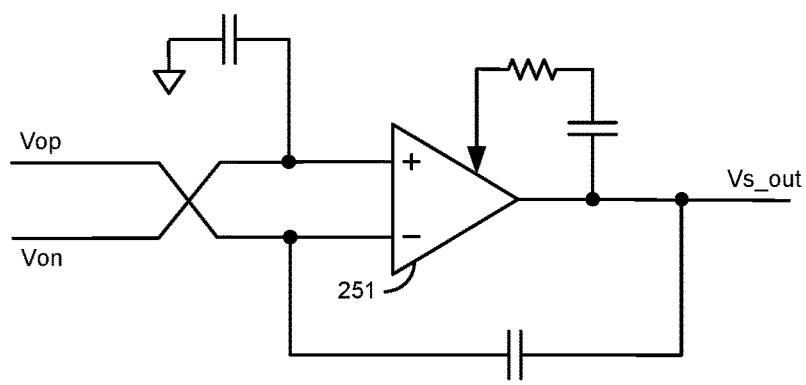
FIG. 9 illustrates a signal conversion circuit 204A in accordance with an embodiment of the present invention.

FIG. 9 illustrates a signal conversion circuit 204A in accordance with an embodiment of the present invention. This signal conversion 204A receives the voltages Vop and Von from the first trans-impedance amplifier, further amplifies the differential voltage (Vop-Von) and then converts the differential voltage into a single ended voltage Vs_out.

Figure 10:
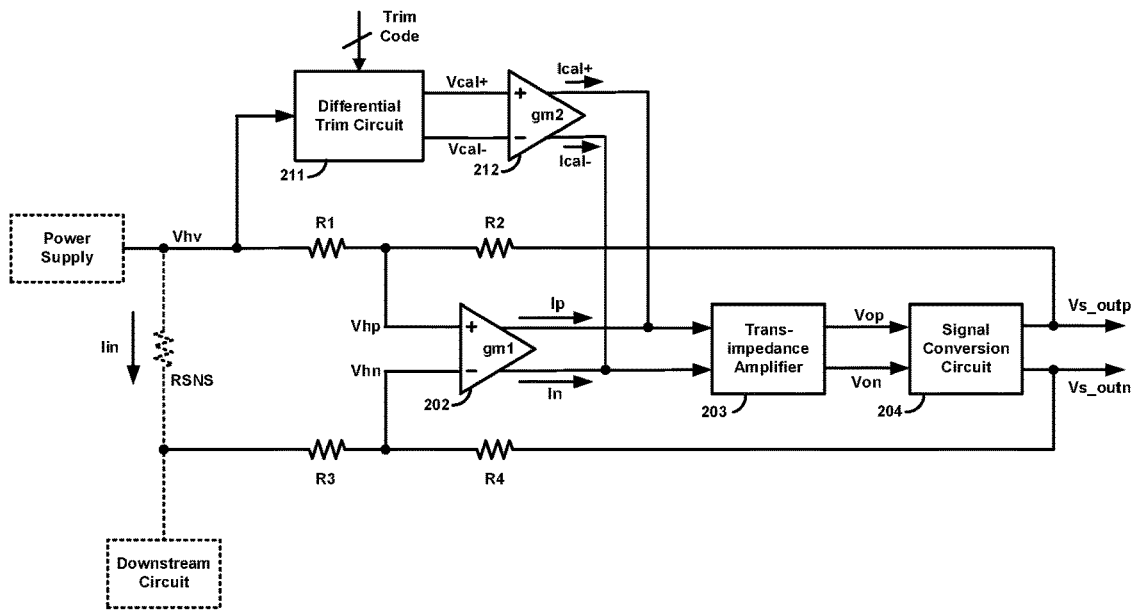
FIG. 10-12 are block diagrams of current sensing circuits in accordance with other embodiments of the present invention.
Figure 11:
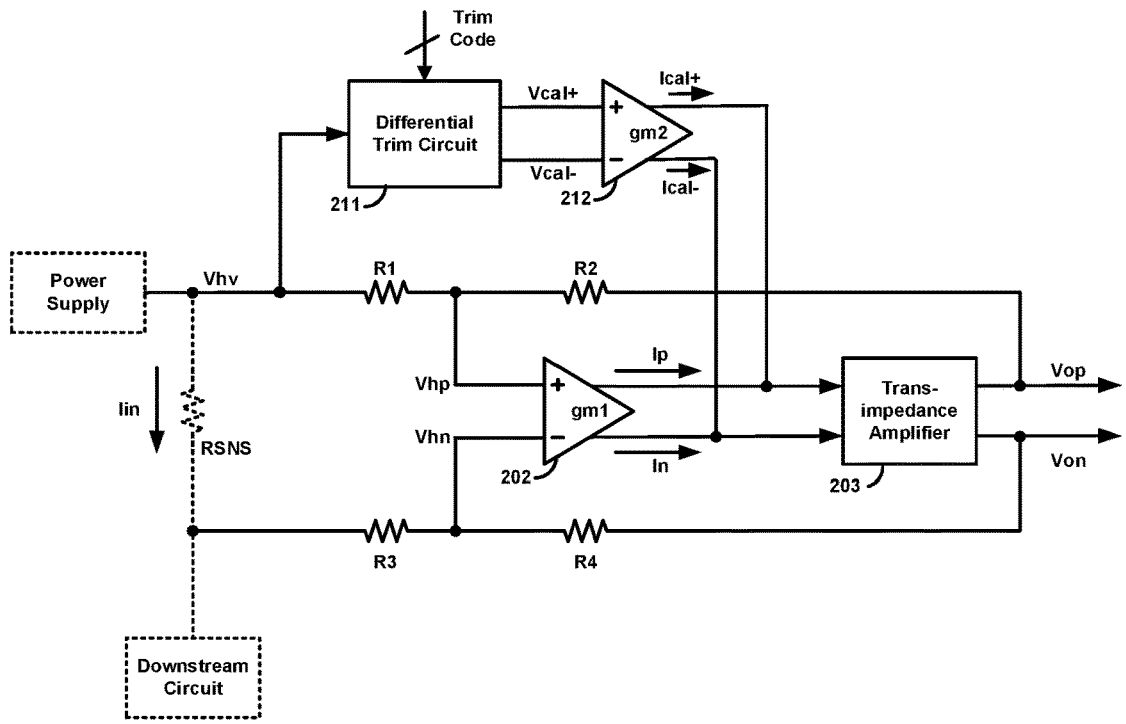

Although the signal conversion circuit of FIG. 9 conducts both signal amplification and differential to single ended signal conversion, this is not intended to limit the invention. The signal conversion circuit could only conduct signal amplification, such as shown in FIG. 10, wherein the current sense amplifier has differential outputs Vs_outp and Vs_outn. In some other embodiments, the signal conversion circuit could be even omitted, such as shown in FIG. 11. In this situation, the voltage Vop and Von generated by the trans-impedance amplifier 203 are directly used as the outputs of the current sense amplifier.

Figure 12:
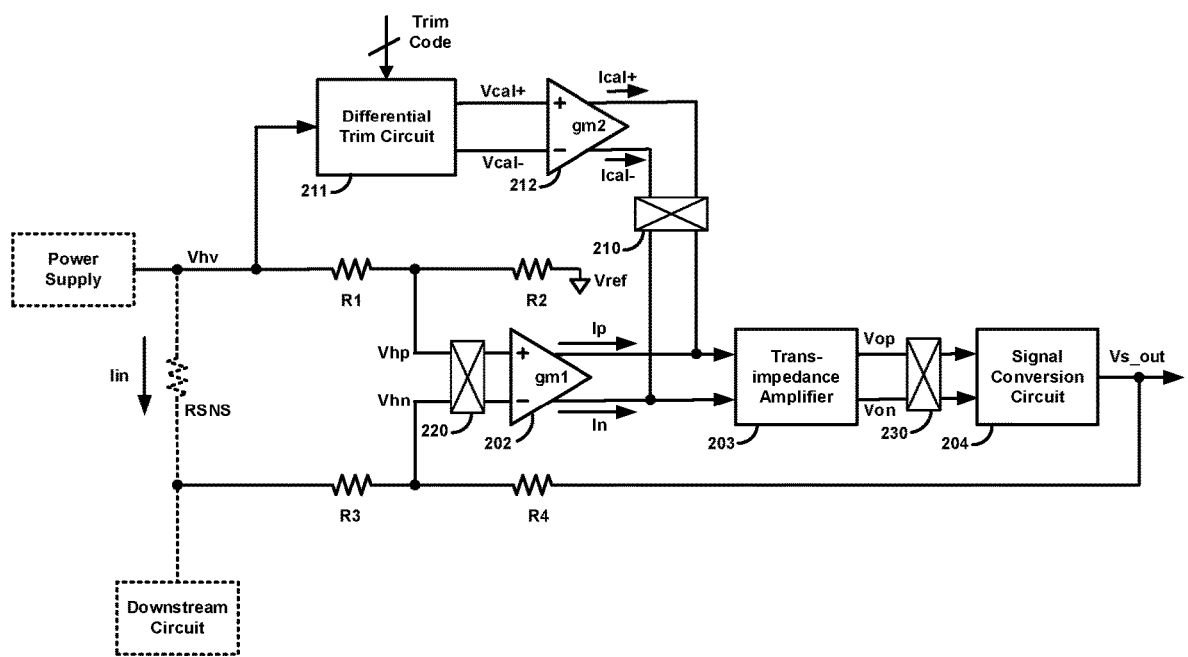

The current sensing circuit in accordance with embodiments of the present invention could also be chopper-stabilized. As shown in FIG. 12, the calibration currents Ical+, Ical–, the inputs of the first trans-conductance amplifier 202, and the outputs of the trans-impedance amplifier 203 are respectively chopped with chopping switches 210, 220 and 230.

Figure 13:
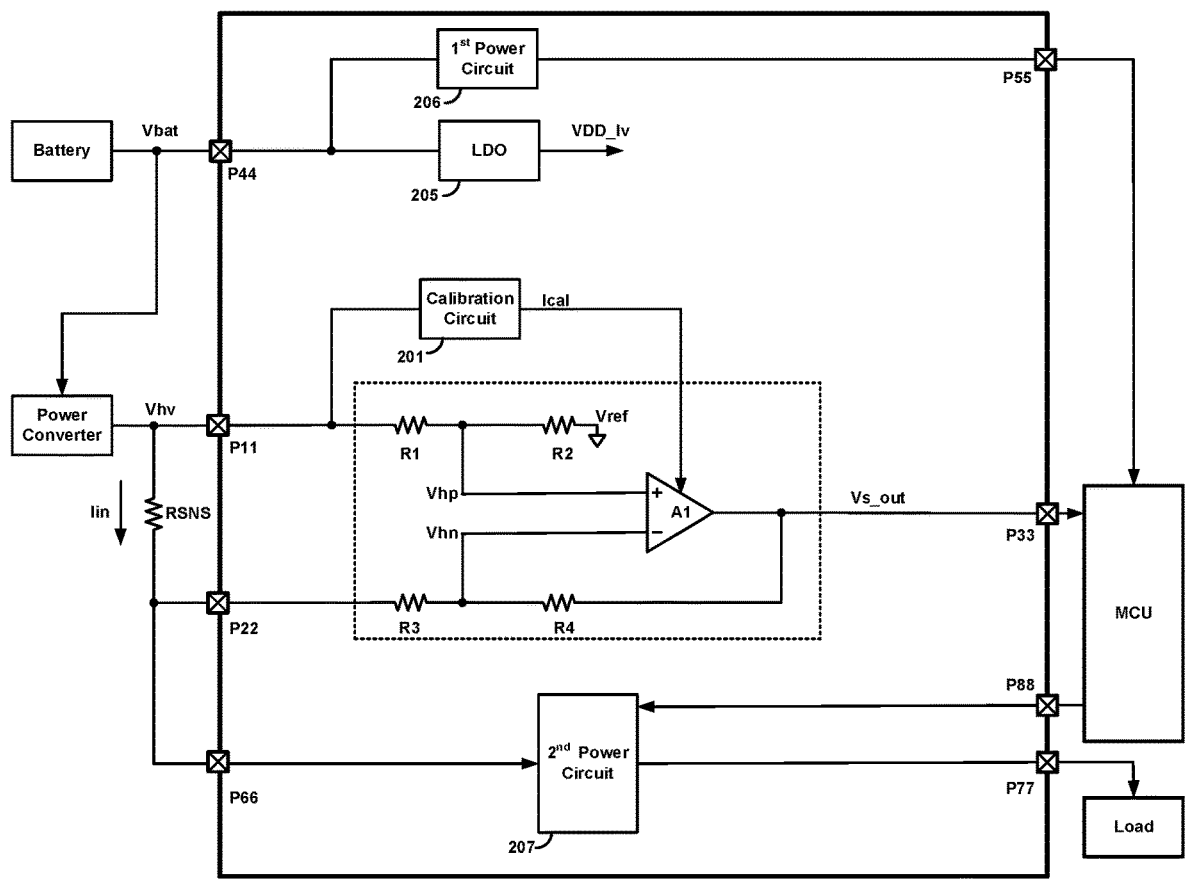
FIG. 13 illustrates a semiconductor chip integrating a current sensing circuit, in accordance with an embodiment of the present invention.

FIG. 13 illustrates a semiconductor chip integrating a current sense amplifier, in accordance with an embodiment of the present invention. The semiconductor chip has a plurality of pins, and integrates a current sense amplifier and also some other blocks.

As shown in FIG. 13, a battery is configured to provide a battery voltage Vbat, which, for example, could be up to 36V. A power converter (such as buck converter, or buck-boost converter) is coupled to the battery to receive the battery voltage Vbat and generate a power input voltage Vhv, which, for example, varies within a range of 1V~36V. A current sense resistor RSNS is coupled to the power converter to receive the power input voltage Vhv and conduct a current Iin.

The chip has a pin P11 configured to be coupled to a first terminal of the current sense resistor RSNS to receive the voltage Vhv, a pin P22 configured to be coupled to a second terminal of the current sense resistor RSNS, and a pin P33 configured to provide a current sensing signal Vs_out indicative of the current Iin, e.g. to an external micro control unit (MCU). The current sense amplifier includes resistors R1~R4 and an operational amplifier A1, wherein the first terminals of the resistors R1 and R3 are respectively coupled to the pins P11 and P22. The output terminal of the operational amplifier A1 is coupled to the pin P33. The resistance of the current sense resistor RSNS should not be too high because it will generate losses. It should not be too low either, so as to achieve high current sensing accuracy. In some embodiments, the current sense resistor RSNS has a resistance among 5~10 milliohm. For example, the current sense resistor RSNS could have a resistance of 7.5 milliohm, the resistors R1 and R3 could have a resistance of 10 kilohm, and the resistors R2 and R4 could have a resistance of 1 megaohm.

To reduce a change in the current sensing signal Vs_out caused by a change in the power input voltage Vhv, in some embodiments, a calibration circuit 201 is further incorporated into the chip. The calibration circuit 201 is coupled to the pin P11 to receive the power input voltage Vhv, and configured to convert the power input voltage Vhv into a calibration current Ical. This calibration current Ical is fed into the operational amplifier A1, e.g. through a low-impedance path, for canceling or minimizing the $V_{hv}*A_{cm}$ component in the equation (6).

The chip has a pin P44 configured to be coupled to the battery to receive the voltage Vbat. An LDO 205 inside the chip receives the voltage Vbat from the pin P44, and converts it into a power supply voltage VDD_lv. In some embodiments, the chip further integrates a first power circuit 206 which is configured to receive the battery voltage Vbat through the pin P44, and provide power to the MCU through a pin P55.

The chip could further integrate a second power circuit 207, which is coupled to the second terminal of the current sense resistor RSNS through a pin P66. This second power circuit 207 is configured to provide power to an external load through one or more pins P77. In some further embodiments, the chip further includes one or more pins P88 for receiving control signals from MCU, these control signals are used to control the second power circuit 207.

This first power circuit 206 and second power circuit 207 could be configured in various topologies. For example, the first power circuit 206 could include two transistors, which cooperate with external components to form a buck converter. The second power circuit 207 could include four transistors configured in a full-bridge. This full-bridge circuit could work with external components to adjust power provided to the load.

Although many detailed circuits are shown in the embodiments above, it is apparent to persons of ordinary skills in the art that, these detailed circuit are only used for illustration purpose only, and are not intended to limit the present invention. Other suitable circuit structure with same or similar function could also be utilized. Besides MOSFETs (metal-oxide semiconductor filed effect transistors), the circuits shown in FIG. 7 and FIG. 8 could adopt other suitable semiconductor devices. And the reference ground used therein could be replaced by a negative voltage provided by a negative charge pump. Furthermore, the polarity of current and voltage signals shown in the figures are used for better illustration, and could be adjusted or exchanged based on practical applications. Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A current sensing circuit for sensing a current flowing through a current sense resistor, wherein the current sense resistor is configured to receive a variable power input voltage, the current sensing circuit comprises:
   a current sense amplifier having a first input terminal, a second input terminal and an output terminal, wherein the first input terminal of the current sense amplifier is configured to be coupled to a first terminal of the current sense resistor to receive the variable power input voltage, the second input terminal of the current sense amplifier is configured to be coupled to a second terminal of the current sense resistor, and the output terminal is configured for providing a current sensing signal indicative of the current flowing through the current sense resistor; and
   a calibration circuit configured to be coupled to the first input terminal of the current sense amplifier to receive the variable power input voltage, wherein the calibration circuit is configured to convert the variable power input voltage into a calibration current, and provide the calibration current to the current sense amplifier to reduce a change in the current sensing signal caused by a change in the variable power input voltage;
   wherein the current sense amplifier comprises:
   an operational amplifier having a first input terminal, a second input terminal, and an output terminal for providing the current sensing signal;
   a first resistor having a first terminal and a second terminal, wherein the first terminal is configured to be coupled to the first terminal of the current sense resistor to receive the variable power input voltage, the second terminal is coupled to the first input terminal of the operational amplifier;
   a second resistor coupled to the first input terminal of the operational amplifier and the second terminal of the first resistor;
   a third resistor having a first terminal and a second terminal, wherein the first terminal is configured to be coupled to a second terminal of the current sense resistor, the second terminal is coupled to the second input terminal of the operational amplifier;
   a fourth resistor coupled between the second input terminal of the operational amplifier and the output terminal of the operational amplifier; and
   further wherein the calibration circuit includes a differential trim circuit having an input terminal, a first output terminal and a second output terminal, wherein the input terminal is coupled to the first terminal of the first resistor, and wherein based on the variable power input voltage and a trimming code, the differential trim circuit generates a first calibration voltage at the first output terminal, and a second calibration voltage at the second output terminal.

2. The current sensing circuit of claim 1, wherein the operational amplifier comprises:
   a first trans-conductance amplifier having a first input terminal, a second input terminal, a first output terminal and a second output terminal, wherein the first input terminal of the first trans-conductance amplifier is coupled to a common connection node of the first resistor and second resistor, the second input terminal of the first trans-conductance amplifier is coupled to a common connection node of the third resistor and fourth resistor, and wherein based on the voltages at the first input terminal and second input terminal, the first trans-conductance generates a first amplifying current at the first output terminal, and a second amplifying current at the second output terminal; and
   a trans-impedance amplifier having a first input terminal, a second input terminal, a first output terminal and a second output terminal, wherein the first input terminal of the trans-impedance amplifier is coupled to the first output terminal of the first trans-conductance amplifier, the second input terminal of the trans-impedance amplifier is coupled to the second output terminal of the first trans-conductance amplifier, and wherein the calibration current is fed into an input terminal of the trans-impedance amplifier.

3. The current sensing circuit of claim 2, wherein the operational amplifier further comprises:
   a signal conversion circuit having a first input terminal, a second input terminal and an output terminal, wherein the first input terminal of the signal conversion circuit is coupled to the first output terminal of the trans-impedance amplifier to receive a first voltage, the second input terminal of the signal conversion circuit is coupled to the second output terminal of the trans-impedance amplifier to receive a second voltage, and wherein based on the first voltage and second voltage, the signal conversion circuit generates the current sensing signal at the output terminal.

4. The current sensing circuit of claim 2, wherein the calibration circuit comprises an input terminal, a first output terminal and a second output terminal, wherein the input terminal of the calibration circuit is coupled to the first terminal of the first resistor, the first output terminal of the calibration circuit is coupled to the first input terminal of the trans-impedance amplifier, the second output terminal of the calibration circuit is coupled to the second input terminal of the trans-impedance amplifier, and wherein the calibration circuit converts the variable power input voltage into a first calibration current at the first output terminal and a second calibration current at the second output terminal, and wherein the first calibration current and the second calibration current both have the same amplitude.

5. The current sensing circuit of claim 2, wherein the calibration circuit further comprises:
   a second trans-conductance amplifier having a first input terminal, a second input terminal, a first output terminal and a second output terminal, wherein the first input terminal of the second trans-conductance amplifier is coupled to the first output terminal of the differential trim circuit, the second input terminal of the second trans-conductance amplifier is coupled to the second output terminal of the differential trim circuit, the first output terminal of the second trans-conductance amplifier is coupled to the first input terminal of the trans-impedance amplifier, the second output terminal of the second trans-conductance amplifier is coupled to the second input terminal of the trans-impedance amplifier, and wherein based on the first calibration voltage and second calibration voltage, the calibration circuit generates a first calibration current at the first output terminal, and a second calibration current at the second output terminal.

6. The current sensing circuit of claim 5, wherein the first trans-conductance amplifier is powered by a first power supply voltage, the trans-impedance amplifier and second trans-conductance amplifier are powered by a second power supply voltage lower than the first power supply voltage.

7. The current sensing circuit of claim 2, further comprising:
   a first chopping switch for chopping the calibration current;
   a second chopping switch for chopping voltages respectively at the first input terminal and the second input terminal of the first trans-conductance amplifier; and
   a third chopping switch for chopping voltages respectively at the first output terminal and the second output terminal of the trans-impedance amplifier.

8. A semiconductor chip comprising:
   a first pin configured to be coupled to a first terminal of a current sense resistor to receive a first power input voltage;
   a second pin configured to be coupled to a second terminal of the current sense resistor;
   a third pin configured to provide a current sensing signal indicative of the current flowing through the current sense resistor;
   a fourth pin configured to receive a second power input voltage, wherein the first power input voltage is generated by a power converter based on the second power input voltage;
   an operational amplifier having a first input terminal, a second input terminal, and an output terminal coupled to the third pin;
   a first resistor coupled between the first pin and the first input terminal of the operational amplifier;
   a second resistor coupled between the second input terminal of the operational amplifier and a reference voltage;
   a third resistor coupled between the second pin and the second input terminal of the operational amplifier;
   a fourth resistor coupled between the second input terminal of the operational amplifier and the output terminal of the operational amplifier;
   a low dropout regulator coupled to the fourth pin, and configured to generate a power supply voltage based on the second power input voltage;
   a micro control unit;
   a fifth pin configured to be coupled to the micro control unit, wherein the micro control unit is configured to be further coupled to the third pin to receive the current sensing signal; and
   a first power circuit coupled between the fourth pin and fifth pin, and configured to provide power to the micro control unit based on the second power input voltage.

9. The semiconductor chip of claim 8, further comprising:
   a sixth pin configured to be coupled to the second terminal of the current sense resistor;
   a seventh pin coupled to a load; and
   a second power circuit coupled between the sixth pin and seventh pin, and configured to provide power to the load based on the voltage at the second terminal of the current sense resistor.

10. The semiconductor chip of claim 9, further comprising:
   an eighth pin coupled to the micro control unit, and configured to receive a control signal from the micro control unit to control the second power circuit.

11. The semiconductor chip of claim 8, further comprising:
   a calibration circuit configured to be coupled to the first pin, wherein the calibration circuit is configured to convert the first power input voltage into a calibration current, and provide the calibration current to the operational amplifier to reduce a change in the current sensing signal caused by a change in the first power input voltage.

12. The semiconductor chip of claim 11, wherein the operational amplifier comprises:
   a first trans-conductance amplifier having a first input terminal, a second input terminal, a first output terminal and a second output terminal, wherein the first input terminal of the first trans-conductance amplifier is coupled to a common connection node of the first resistor and second resistor, the second input terminal of the first trans-conductance amplifier is coupled to a common connection node of the third resistor and fourth resistor, and wherein based on the voltages at the first input terminal and second input terminal, the first trans-conductance generates a first amplifying current at the first output terminal, and a second amplifying current at the second output terminal;
   a trans-impedance amplifier having a first input terminal, a second input terminal, a first output terminal and a second output terminal, wherein the first input terminal of the trans-impedance amplifier is coupled to the first output terminal of the first trans-conductance amplifier, the second input terminal of the trans-impedance amplifier is coupled to the second output terminal of the first trans-conductance amplifier, and wherein the calibration current is fed into an input terminal of the trans-impedance amplifier; and
   a signal conversion circuit having a first input terminal, a second input terminal and an output terminal, wherein the first input terminal of the signal conversion circuit is coupled to the first output terminal of the trans-impedance amplifier to receive a first voltage, the second input terminal of the signal conversion circuit is coupled to the second output terminal of the trans-impedance amplifier to receive a second voltage, and wherein based on the first voltage and second voltage, the signal conversion circuit generates the current sensing signal at the output terminal.

13. The semiconductor chip of claim 12, wherein the calibration circuit comprises:
a differential trim circuit having an input terminal, a first output terminal and a second output terminal, wherein the input terminal is coupled to the first terminal of the first resistor, and wherein based on the first power input voltage and a trimming code, the differential trim circuit generates a first calibration voltage at the first output terminal, and a second calibration voltage at the second output terminal; and
a second trans-conductance amplifier having a first input terminal, a second input terminal, a first output terminal and a second output terminal, wherein the first input terminal of the second trans-conductance amplifier is coupled to the first output terminal of the differential trim circuit, the second input terminal of the second trans-conductance amplifier is coupled to the second output terminal of the differential trim circuit, the first output terminal of the second trans-conductance amplifier is coupled to the first input terminal of the trans-impedance amplifier, the second output terminal of the second trans-conductance amplifier is coupled to the second input terminal of the trans-impedance amplifier, and wherein based on the first calibration voltage and second calibration voltage, the calibration circuit generates a first calibration current at the first output terminal, and a second calibration current at the second output terminal.

14. The semiconductor chip of claim 13, wherein the first trans-conductance amplifier is powered by the first power input voltage, the trans-impedance amplifier and second trans-conductance amplifier are powered by the power supply voltage, wherein the power supply voltage is lower than the first power input voltage.

15. The semiconductor chip of claim 12, further comprising:
a first chopping switch for chopping the calibration current;
a second chopping switch for chopping voltages respectively at the first input terminal and the second input terminal of the first trans-conductance amplifier; and
a third chopping switch for chopping voltages respectively at the first output terminal and the second output terminal of the trans-impedance amplifier.

16. An adaptive calibration method used in a current sensing circuit, wherein the current sensing circuit is configured for sensing a current flowing through a current sense resistor, the adaptive calibration method comprises:
converting the voltage across the current sense resistor into an amplifying current through a first trans-conductance amplifier;
converting a variable power input voltage at a first terminal of the current sense resistor into a calibration current based on a trim code through a calibration circuit; and
converting a combination of the amplifying current and the calibration current into a current sensing signal indicative of the current flowing through the current sense resistor, through a trans-impedance amplifier.

17. The adaptive calibration method of claim 16, further comprising:
setting the variable power input voltage to a first voltage value;
measuring the current sensing signal to get a first current sensing voltage;
setting the variable power input voltage to a second voltage value;
measuring the current sensing signal to get a second current sensing voltage; and
generating the trim code based on the difference between the first current sensing voltage and the second current sensing voltage.

18. The adaptive calibration method of claim 16, further comprising:
chopping the calibration current with a first chopping switch;
chopping voltages at input terminals of the first trans-conductance amplifier with a second chopping switch; and
chopping voltages at output terminals of the trans-impedance amplifier with a third chopping switch.

* * * * *